United States Patent [19]

Haluska et al.

[11] Patent Number: 4,822,697

[45] Date of Patent: Apr. 18, 1989

[54] PLATINUM AND RHODIUM CATALYSIS OF LOW TEMPERATURE FORMATION MULTILAYER CERAMICS

[75] Inventors: Loren A. Haluska; Keith W. Michael, both of Midland; Leo Tarhay, Sanford, all of Mich.

[73] Assignee: Dow Corning Corporation, Midland, Mich.

[21] Appl. No.: 937,273

[22] Filed: Dec. 3, 1986

[51] Int. Cl.$^4$ .................................................. B32B 9/00
[52] U.S. Cl. ........................................ 428/698; 427/38; 427/53.1; 427/74; 427/54.1; 427/99; 427/126.2; 427/126.4; 427/255.2; 427/376.2; 427/380; 427/419.2; 427/419.7; 428/702; 428/704
[58] Field of Search ................ 427/38, 53.1, 74, 54.1, 427/99, 126.2, 126.4, 255.2, 376.2, 380, 419.2, 419.7; 428/698, 702, 704

[56] References Cited

U.S. PATENT DOCUMENTS

| | | |
|---|---|---|
| 4,312,970 | 2/1981 | Gaul . |
| 4,340,619 | 1/1981 | Gaul . |
| 4,395,460 | 9/1981 | Gaul . |
| 4,397,828 | 8/1983 | Seyferth et al. . |
| 4,404,153 | 9/1983 | Gaul . |
| 4,482,669 | 11/1984 | Seyferth et al. . |
| 4,482,689 | 11/1984 | Haluska . |
| 4,535,007 | 8/1985 | Cannady . |
| 4,540,803 | 9/1985 | Cannady . |
| 4,543,344 | 9/1985 | Cannady . |

OTHER PUBLICATIONS

U.S. Ser. No. 835,029, 2/28/1986, Varaprath.
U.S. Ser. No. 926,145, 11/03/1986, Haluska.
U.S. Ser. No. 926,607, 11/04/1986, Haluska.
U.S. Ser. No. 652,939, 9/21/1984, Baney et al.
Gupta & Chin, Characterization of Spin-On Glass Films as a Planarizing Dielectric, 1985, 22, 349–365.
Glaser & Pantano, Effect of the H$_2$O/Teos Ratio Upon the Preparation & Nitridation of Silica Sol/Gel Films, 1984, Journal of Non-Crystalline Solids, 63, 209–221.
Frye et al., 1970, JACS 92, 5586.

Primary Examiner—Bernard Pianalto
Attorney, Agent, or Firm—James E. Bittell

[57] ABSTRACT

This invention relates to materials produced by diluting in a solvent a platinum or rhodium catalyzed preceramic mixture of a hydrogen silsesquioxane resin. The preceramic mixture solvent solution is applied to a substrate and ceramified by heating. One or more ceramic coatings containing silicon carbon, silicon nitrogen, or silicon carbon nitrogen can be applied over the ceramified SiO$_2$ coating. A CVD or PECVD top coating can be applied for further protection. The invention is particularly useful for coating electronic devices.

52 Claims, No Drawings

4,822,697

PLATINUM AND RHODIUM CATALYSIS OF LOW TEMPERATURE FORMATION MULTILAYER CERAMICS

BACKGROUND OF THE INVENTION

Electronic devices, to be serviceable under a wide variety of environmental conditions, must be able to withstand moisture, heat, and abrasion resistance, among other stresses. A significant amount of work has been reported directed toward the preparation of coatings for electronic devices which can increase the reliability of the devices. None of the conventional coatings available today, including ceramic and metal packaging, can perform well enough by itself to protect an electronic device against all environmental stresses.

A common cause of failure of electronic devices is microcracks or voids in the surface passivation of the semiconductor chip allowing the introduction of impurities. Thus a need exists for a method which will overcome the formation of microcracks, voids or pinholes in inorganic coatings of electronic devices.

Passivating coatings on electronic devices can provide barriers against ionic impurities, such as chloride ion (Cl−) and sodium ion (Na+), which can enter an electronic device and disrupt the transmission of electronic signals. The passivating coating can also be applied to electronic devices to provide some protection against moisture and volatile organic chemicals.

Amorphous silicon (hereinafter a-Si) films have been the subject of intense research for various applications in electronic industries, however, the use of a-Si films for environmental or hermetic protection of electronic devices is unknown. A number of possible processes have been previously disclosed for forming a-Si films. For instance, for producing films of amorphous silicon, the following deposition processes have been used: chemical vapor deposition (CVD), plasma enhanced CVD (PECVD), reactive sputtering, ion plating and photo-CVD, etc. Generally, the plasma enhanced CVD process is industrialized and widely used for depositing a-Si films.

Known to those skilled in the art is the utility of substrate planarization as an interlayer within the body of an electronic device and between the metallization layers. Gupta and Chin (Microelectronics Processing, Chapter 22, "Characteristics of Spin-On Glass Films as a Planarizing Dielectric", pp349–65, American Chemical Society, 1986) have shown multilevel interconnect systems with isolation of metallization levels by conventional interlevel dielectric insulator layers of doped or undoped $SiO_2$, glass films. However, CVD dielectric films provide only at best a conformal coverage of substrate features which is not conducive to continuous and uniform step coverage by an overlying metallization layer. The poor step coverage results in discontinuous and thin spots in the conductor lines causing degradation of metallization yields as well as device reliability problems. Spin-on glass films have been utilized to provide interlayer isolation between the metallization layers, the top layer of which is later patterned by lithographic techniques. Topcoat planarization on the surface of an electronic device as opposed to planarizing interlevel dielectric layers, however, is unknown.

Under the teachings of the prior art, a single material most often will not suffice to meet the ever increasing demands of specialty coating applications, such as those found in the electronics industry. Several coating properties such as microhardness, moisture resistance, ion barrier, adhesion, ductility, tensile strength, thermal expansion coefficients, etc., need to be provided by successive layers of different coatings.

Silicon and nitrogen-containing preceramic polymers, such as silazanes have been disclosed in various patents, including U.S. Pat. No. 4,404,153, issued Sept. 13, 1983 to Gaul, wherein there is disclosed a process for preparing $R'_3SiNH$— containing silazane polymers by contacting and reacting chlorine-containing disilanes with $(R'_3Si)_2NH$ where $R'$ is vinyl, hydrogen, an alkyl radical of 1 to 3 carbon atoms or the phenyl group. Gaul also teaches therein the use of the preceramic silazane polymers to produce silicon-carbon-nitrogen-containing ceramic materials.

Gaul in U.S. Pat. No. 4,312,970, issued Jan. 26, 1982, obtained ceramic materials by the pyrolysis of preceramic silazane polymers, which polymer were prepared by reacting organochlorosilanes and disilazanes.

Gaul in U.S. Pat. No. 4,340,619, issued July 20, 1982, obtained ceramic materials by the pyrolysis of preceramic silazane polymers, which polymers were prepared by reacting chlorine-containing disilanes and disilazanes.

Cannady in U.S. Pat. No. 4,540,803, issued Sept. 10, 1985, obtained ceramic materials by the pyrolysis of preceramic silazane polymers, which polymers were prepared by reacting trichlorosilane and disilazanes.

Frye and Collins teach in U.S. Pat. No. 3,615,272, issued Oct. 26, 1971, and also in Frye, et al., J. Am. Chem. Soc., 92, p.5586, 1970, the formation of hydrogen silsesquioxane resin.

The instant invention relates to the enhancement of the protection of electronic devices by the low temperature formation of thin multilayer ceramic or ceramic-like coatings on the surface of the device. What has been discovered is a method of forming coatings for electronic devices from catalyzed hydrogen silsesquioxane resin and one or more silicon-and nitrogen-containing ceramic or ceramic-like coatings.

SUMMARY OF THE INVENTION

The instant invention relates to the low temperature formation of monolayer and multilayer coatings for the protection of electronic devices. The monolayer coatings of the present invention comprise a coating prepared by depositing on an electronic device a platinum or rhodium catalyzed solvent solution of hydrogen silsesquioxane resin, $(HSiO_{3/2})_n$. The dual-layer coatings of the present invention comprise (1) a coating prepared by depositing on an electronic device a platinum or rhodium catalyzed solvent solution of hydrogen silsesquioxane resin, $(HSiO_{3/2})_n$, and (2) a topcoat of silicon-containing material, or silicon nitrogen-containing material, or silicon carbon-containing material, or silicon carbon nitrogen-containing material. The first layer is a $SiO_2$ planarizing and passivating coating that is applied by known techniques, including flow coating, spin coating, dip coating and spray coating of an electronic device. The second layer is a barrier coating of silicon-containing material derived from the CVD or plasma enhanced CVD of halosilanes or halodisilanes, silazanes, or mixtures of alkanes, silanes and ammonia.

The instant invention also relates to the formation of a three layer coating system for the protection of electronic devices wherein the first layer is a platinum and/or rhodium catalyzed $SiO_2$-containing planarizing coating obtained from a solvent solution of hydrogen silsesquioxane resin $(HSiO_{3/2})_n$, wherein upon heat treatment, the material ceramifies to form an essentially $SiO_2$-containing material. The second layer, used for passivation, is a ceramic or ceramic-like coating obtained by the ceramification of a preceramic silicon nitrogen-containing polymer coating, or is a silicon nitrogen-containing, silicon carbon nitrogen-containing, or silicon carbon-containing layer deposited by thermal, UV, CVD, plasma enhanced CVD, or laser techniques. The third layer in the three layer coatings of the present invention is a top coating of (a) silicon-containing material applied by CVD, plasma enhanced CVD, or metal assisted CVD of a halosilane, halodisilane, halopolysilane, or mixtures thereof, or (b) silicon carbon-containing material, applied by CVD or plasma enhanced CVD of a halosilane, halodisilane, halopolysilane, or mixtures thereof, and an alkane or alkylsilane, or (c) silicon nitrogen-containing material applied by CVD or plasma enhanced CVD of a halosilane, halodisilane, halopolysilane, or mixtures thereof, and ammonia, or (d) silicon carbon nitrogen-containing material applied by CVD or plasma enhanced CVD of hexamethyldisilazane or mixtures of silanes, alkanes, alkylsilanes and ammonia.

The catalyzed planarizing $SiO_2$ layers of the present invention exhibit improved weight loss reduction over that of the uncatalyzed $SiO_2$ planarizing layer.

DETAILED DESCRIPTION OF THE INVENTION

The instant invention relates to the discovery that hydrogen silsesquioxane resin $(HSiO_{3/2})_n$ is useful for the preparation of novel precursor polymers that can be converted at low temperatures in the presence of platinum and/or rhodium catalysts to ceramic materials useful as planarizing coatings for irregular surfaces of electronic devices. The use of platinum catalysts, such as, for example, $(CH_3CH_2S)_2PtCl_2$, and $Pt(CH_3CH(O)CHCH(O)CH_3)_2$, or rhodium catalyst, such as $RhCl_3(CH_3CH_2CH_2CH_2S)_3$, in the instant invention enhances the oxidation and cure of the $(HSiO_{3/2})_n$ resin. In addition, the platinum and/or rhodium catalysis of the instant invention assists in the reduction or elimination of residual SiH functionality on the $(HSiO_{3/2})_n$ resin, further increasing the production of $SiO_2$. Furthermore, catalysis of the hydrogen silsesquioxane resin planarizing layer with platinum and/or rhodium complexes significantly reduces the weight loss observed on curing. The silicon dioxide ceramic coatings produced by the method of the present invention minimize mechanical stresses caused by the irregular topography of an integrated circuit and also help prevent microcracking of subsequent multilayer coatings under thermal cycling conditions.

It is an object of the instant invention to provide a process to produce ceramic or ceramic-like planarizing coatings from carbon-free precursor materials. This is achieved according to the process of the present invention by the use of platinum and/or rhodium catalyzed hydrogen silsesquioxane resin $(HSiO_{3/2})_n$ solution deposited onto an electronic device and ceramified.

The instant invention further relates to the discovery that these catalyzed silicon dioxide ($SiO_2$-containing) ceramic or ceramic-like coatings can be coated with various silicon, carbon and/or nitrogen-containing materials for the protection of electronic devices as well as other integrated circuits.

In the instant invention, by "ceramic-like" is meant those pyrolyzed materials which are not fully free of residual carbon and/or hydrogen but which are otherwise ceramic-like in character. By "electronic device" in the instant invention is meant devices including, but not limited to, electronic devices, silicon based devices, gallium arsenide devices, focal plane arrays, opto-electronic devices, photovoltaic cells and optical devices. The coatings of the instant invention are also useful as dielectric layers, doped dielectric layers to produce transistor-like devices, pigment loaded binder systems containing silicon to produce capacitors and capacitor-like devices, multilayer devices, 3-D devices, silicon-on-insulator (SOI) devices, super lattice devices and the like.

The instant invention also relates to a process for the formation of silicon-containing top coatings for ceramic or ceramic-like coated electronic devices whereby the topcoat is prepared by plasma enhanced CVD, metal catalyzed CVD techniques, or other CVD techniques.

The instant invention also relates to a process for forming on a substrate a ceramic or ceramic-like $SiO_2$ coating which process comprises (A) coating an electronic device with a planarizing coating by means of diluting hydrogen silsesquioxane resin $(HSiO_{3/2})_n$ to low solids with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device; (B) drying the catalyzed diluted hydrogen silsesquioxane resin solution so as to evaporate the solvent and thereby deposit a catalyzed hydrogen silsesquioxane resin preceramic coating on the electronic device; (C) ceramifying the catalyzed hydrogen silsesquioxane resin preceramic coating to silicon dioxide by heating the coated device to a temperature between 150 and 1000 degrees Centigrade to produce a ceramic or ceramic-like planarizing $SiO_2$ coating on the device.

In addition, the instant invention relates to a process for forming on a substrate a multilayer, ceramic or ceramic-like, coating which process comprises (A) coating an electronic device with a coating by means of diluting hydrogen silsesquioxane resin $(HSiO_{3/2})_n$ with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device; drying the catalyzed diluted hydrogen silsesquioxane resin solution so as to evaporate the solvent and thereby deposit a catalyzed hydrogen silsesquioxane resin preceramic coating on the electronic device, ceramifying the catalyzed hydrogen silsesquioxane resin preceramic coating to silicon dioxide by heating the coated device to a temperature between 150 and 1000 degrees Centigrade to produce a ceramic or ceramic-like $SiO_2$ coating, and (B) applying to the ceramic or ceramic-like $SiO_2$ coated device a silicon-containing coating by means of decomposing in a reaction chamber a silane, halosilane, halodisilane, halopolysilane, or mixture thereof in the vapor phase, at a temperature between 200 and 600 degrees Centigrade, in the presence of the ceramic or ceramic-like coated device, whereby an electronic device containing a multilayer, ceramic or ceramic-like, coating thereon is obtained. The process for applying the planarizing or passivating coatings on the electronic device can be, but is not limited to, flow coating, spin coating, spray or dip coating techniques.

The instant invention further relates to a process for forming on a substrate a multilayer, ceramic or ceramic-like, coating which process comprises (A) coating an electronic device with a coating by means of diluting hydrogen silsesquioxane resin $(HSiO_{3/2})_n$ with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device; drying the catalyzed diluted hydrogen silsesquioxane resin $(HSiO_{3/2})_n$ solution so as to evaporate the solvent and thereby deposit a catalyzed hydrogen silsesquioxane resin $(HSiO_{3/2})_n$ preceramic material coating on the electronic device, ceramifying the catalyzed hydrogen silsesquioxane resin $(HSiO_{3/2})_n$ preceramic material coating to silicon dioxide by heating the coated device to a temperature between 150 and 1000 degrees Centigrade to produce a ceramic or ceramic-like coating, and (B) applying to the ceramic or ceramic-like coated device a silicon nitrogen-containing coating by means of applying to the ceramic or ceramic-like coated device a passivating coating comprising a silicon nitrogen-containing material produced by means of diluting in a solvent a preceramic silicon nitrogen-containing polymer, coating the ceramic or ceramic-like coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the ceramic or ceramic-like coated electronic device, and heating the coated device to a temperature of 150 to 1000 degrees Centigrade in an inert or ammonia-containing atmosphere to produce a ceramic or ceramic-like silicon nitrogen-containing coating on the electronic device.

The instant invention also relates to a process for forming on a substrate a multilayer, ceramic or ceramic-like, coating which process comprises (A) coating an electronic device with a coating by means of diluting hydrogen silsesquioxane resin $(HSiO_{3/2})_n$ with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device; drying the catalyzed diluted hydrogen silsesquioxane resin $(HSiO_{3/2})_n$ solution so as to evaporate the solvent and thereby deposit a catalyzed hydrogen silsesquioxane resin $(HSiO_{3/2})_n$ preceramic material coating on the electronic device, ceramifying the catalyzed hydrogen silsesquioxane resin $(HSiO_{3/2})_n$ preceramic material coating to silicon dioxide by heating the coated device to a temperature between 150 and 1000 degrees Centigrade to produce a ceramic or ceramic-like coating, and (B) applying to the ceramic or ceramic-like coated device a silicon carbon-containing coating by means of decomposing in a reaction chamber a silane, alkylsilane, halosilane, halodisilane, halopolysilane, or mixture thereof, and a material selected from the group consisting of alkanes of one to six carbon atoms, alkylsilanes, and alkylhalosilanes, in the vapor phase, at a temperature between 150 and 1000 degrees Centigrade, in the presence of the ceramic or ceramic-like coated device, whereby an electronic device containing a multilayer, ceramic or ceramic-like, coating thereon is obtained.

The instant invention further relates to a process for forming on a substrate a multilayer, ceramic or ceramic-like, coating which process comprises (A) coating an electronic device with a coating by means of diluting hydrogen silsesquioxane resin $(HSiO_{3/2})_n$ with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device; drying the catalyzed diluted hydrogen silsesquioxane resin $(HSiO_{3/2})_n$ solution so as to evaporate the solvent and thereby deposit a catalyzed hydrogen silsesquioxane resin $(HSiO_{3/2})_n$ preceramic material coating on the electronic device, ceramifying the catalyzed hydrogen silsesquioxane resin $(HSiO_{3/2})_n$ preceramic material coating to silicon dioxide by heating the coated device to a temperature between 150 and 1000 degrees Centigrade to produce a ceramic or ceramic-like coating, and (B) applying to the ceramic or ceramic-like coated device a passivating coating which comprises a silicon nitrogen-containing material by means of diluting with a solvent a preceramic silicon nitrogen-containing polymer, coating the ceramic or ceramic-like coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the ceramic or ceramic-like coated electronic device, heating the coated device to a temperature of 150 to 1000 degrees Centigrade in an inert or ammonia-containing atmosphere to produce the ceramic or ceramic-like silicon nitrogen-containing coating, and (C) applying to the ceramic or ceramic-like coated device a silicon-containing coating by means of decomposing in a reaction chamber a silane, halosilane, halodisilane or halopolysilane, or mixture thereof, in the vapor phase, at a temperature between 200 and 600 degrees Centigrade, in the presence of the ceramic or ceramic-like coated device, whereby an electronic device containing a multilayer, ceramic or ceramic-like, coating thereon is obtained.

The invention also relates to a process for forming on a substrate a multilayer, ceramic or ceramic-like, coating which process comprises (A) coating an electronic device with a coating by means of diluting hydrogen silsesquioxane resin $(HSiO_{3/2})_n$ with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device; drying the catalyzed diluted hydrogen silsesquioxane resin $(HSiO_{3/2})_n$ solution so as to evaporate the solvent and thereby deposit a catalyzed hydrogen silsesquioxane resin $(HSiO_{3/2})_n$ preceramic material coating on the electronic device, ceramifying the catalyzed hydrogen silsesquioxane resin $(HSiO_{3/2})_n$ preceramic material coating to silicon dioxide by heating the coated device to a temperature between 150 and 1000 degrees Centigrade to produce a ceramic or ceramic-like coating, and (B) applying to the ceramic or ceramic-like coated device a passivating coating which comprises a silicon nitrogen-containing material by means of diluting with a solvent a preceramic silicon nitrogen-containing polymer, coating the ceramic or ceramic-like coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the ceramic or ceramic-like coated electronic device, heating the coated device to a temperature beween 150 and 1000 degrees Centigrade in an inert or ammonia-containing atmosphere to produce the ceramic or ceramic-like silicon nitrogen-containing coating, and (C) applying to the ceramic or ceramic-like coated device a silicon nitrogen-containing coating by means of decomposing in a reaction chamber a silane, halosilane, halodisilane, halopolysilane, or mixture thereof and ammonia, in the vapor phase, at a temperature between 150 and 1000 degrees Centigrade, in the presence of the ceramic or ceramic-like coated device, whereby an electronic device containing a multilayer, ceramic or ceramic-like, coating thereon is obtained.

The instant invention further relates to a process for forming on a substrate a multilayer, ceramic or ceramic-like, coating which process comprises (A) coating an electronic device with a coating by means of diluting hydrogen silsesquioxane resin $(HSiO_{3/2})hd n$ with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device; drying the catalyzed hydrogen silsesquioxane resin $(HSiO_{3/2})_n$ solution so as to evaporate the solvent and thereby deposit a catalyzed hydrogen silsesquioxane resin $(HSiO_{3/2})_n$ preceramic material coating on the electronic device, ceramifying the catalyzed hydrogen silsesquioxane resin $(HSiO_{2/3})_n$ preceramic material coating to silicon dioxide by heating the coated device to a temperature between 150 and 1000 degrees Centigrade to produce a ceramic or ceramic-like coating, and (B) applying to the ceramic or ceramic-like coated device a passivating coating which comprises a silicon nitrogen-containing material by means of diluting with a solvent a preceramic silicon nitrogen-containing polymer, coating the ceramic or ceramic-like coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the ceramic or ceramic-like coated electronic device, heating the coated device to a temperature between 150 and 1000 degrees Centigrade in an inert or ammonia-containing atmosphere to produce a ceramic or ceramic-like silicon nitrogen-containing coating, and (C) applying to the ceramic or ceramic-like coated device a silicon carbon-containing coating by means of decomposing in a reaction chamber a silane, halosilane, halodisilane, halopolysilane, alkylsilane, or mixtures thereof, and an alkane of one to six carbon atoms or an alkylsilane, in the vapor phase, at a temperature between 150 and 1000 degrees Centigrade, in the presence of the ceramic or ceramic-like coated device, whereby an electronic device containing a multilayer, ceramic or ceramic-like, coating thereon is obtained.

In the instant invention, hydrogen silsesquioxane resin $(HSiO_{3/2})_n$ is diluted (e.g., 0.1 to 10 weight %) with a solvent such as n-heptane or toluene. To the solution of silsesquioxane resin is added the platinum catalysts or rhodium catalyst in the form of, for example, 60 parts per million of $(CH_3CH_2S)_2PtCl_2$ in 0.01 gram of toluene. The catalyzed preceramic solvent solution is then coated onto an electronic device and the solvent allowed to evaporate by drying at ambient conditions. The process of coating the catalyzed preceramic polymer solution onto the electronic device can be, but is not limited to, spin coating, dip coating, spray coating, or flow coating. The catalyzed hydrogen silsesquioxane resin $(HSiO_{3/2})_n$ preceramic material is oxidized in air to a $SiO_2$-containing material. By this means is deposited a preceramic polymer coating which is ceramified by heating the coated device, for example, for approximately one hour at 400 degrees Centigrade. A thin ceramic or ceramic-like planarizing coating of less than 2 microns (or approximately 3000 to 5000 Angstroms) is thus produced on the device. The planarizing coating thus produced can then be coated with a passivating silicon nitrogen-containing ceramic or ceramic-like coating according to the present invention or with a CVD applied silicon-containing coating, silicon carbon-containing coating, or silicon nitrogen-containing coating or a combination of these coatings.

Another significant result of catalyzing the silsesquioxane resin with platinum and/or rhodium is the beneficial reduction in the amount of weight loss observed on exposure to elevated temperatures. Thus, the silsesquioxane resin exposed to increasing temperatures in thermogravimetric analysis (TGA) under a helium atmosphere but in absence of platinum catalyst, exhibited a 20% weight loss while the silsesquioxane resin catalyzed with the platinum catalyst exhibited only a 14% weight loss. The significant improvement of 6% in reduction of weight loss resulting from the platinum catalyst is indicative of improved crosslinking of the resin to form higher molecular weight polymers with higher char yields, a feature important in ceramification.

Furthermore, TGA experiments run in air on the uncatalyzed and platinum catalyzed silsesquioxane resin demonstrate a 9% weight loss in the former but a 6% weight gain in the latter, i.e., the catalyzed sample displayed an initial 4% loss as unreacted material volatilized but upon continued heating from about 400 degrees to 1000 degrees centigrade the sample gained 6% weight above the starting weight as a result of oxidation.

With rhodium catalysis, another sample of hydrogen silsesquioxane resin heated to 1000° Centigrade under helium exhibited a 30% weight loss but a 68% weight loss was observed under identical conditions without the rhodium catalysis. When catalyzed with rhodium and oxidized in air, the hydrogen silsesquioxane resin exhibited a 7% weight gain, similar to the gain observed with platinum catalysis, due to oxygen incorporation. However, in the absence of rhodium catalyst, the same resin lot showed a 28% weight loss upon heating to 1000° Centigrade in air.

Thus, the platinum catalyst or rhodium catalyst facilitates the oxidation of any residual SiH moieties first to SiOH and then further to SiOSi. This oxidative weight gain phenomenon was not observed in the uncatalyzed silsesquioxane resin samples. The higher molecular weights and reduction in weight loss achievable by the present invention are important advances over the prior art because subsequent ceramification of the higher molecular weight polymers can produce higher ceramic yields.

The cure of the hydrogen silsesquioxane resin is not limited herein to oxidative curing in air. The above discussion illustrates the utility of the present invention to cure the hydrogen silsesquioxane resin with platinum catalysts or rhodium catalysts in the absence of air. In addition, the resin can be cured with platinum or rhodium catalysts in an ammonia-containing atmosphere.

The platinum catalysts and rhodium catalysts operative in the present invention include, but are not limited to, $(CH_3C_2S)_2PtCl_2$, platinum acetylacetonate, and rhodium catalyst $RhCl_3(CH_3CH_2CH_2CH_2S)_3$, obtained from Dow Corning Corporation, Midland, Mich. Any platinum or rhodium compound or complex which can be solubilized in the hydrogen silsesquioxane resin will serve to catalyze the cure and is within the scope of this patent.

The second and passivating silicon nitrogen-containing layer of the composite coatings in the instant invention provides resistance against ionic impurities. Preceramic silicon nitrogen-containing polymers suitable for use in this present invention are well known in the art, including, but not limited to, silazanes, disilazanes, polysilazanes, cyclic silazanes, and other silicon nitrogen-containing materials. The preceramic silicon nitrogen-containing polymers suitable for use in this invention must be capable of being converted to a ceramic or ceramic-like material at elevated temperatures. Mixtures of preceramic silazane polymers and/or other silicon- and nitrogen-containing materials may also be used in this invention. Examples of preceramic silazane polymers or polysilazanes suitable for use in this invention include polysilazanes as described by Gaul in U.S. Pat. Nos. 4,312,970 (issued Jan. 26, 1982), 4,340,619 (issued July 20, 1982), 4,395,460 (issued July 26, 1983), and 4,404,153 (issued Sept. 13, 1983), all of which are hereby incorporated by reference. Suitable polysilazanes also include those described by Haluska in U.S. Pat. No. 4,482,689 (issued Nov. 13, 1984) and by Seyferth et al. in U.S. Pat. No. 4,397,828 (issued Aug. 9, 1983), and Seyferth et al, in U.S. Pat. No. 4,482,669 (issued Nov. 13, 1984) which are hereby incorporated by reference. Other polysilazanes suitable for use in this invention are disclosed by Cannady in U.S. Pat. Nos. 4,540,803 (issued Sept. 10, 1985), 4,535,007 (issued Aug. 13, 1985), and 4,543,344 (issued Sept. 24, 1985), and by Baney et al, in U.S. patent application Ser. No. 652,939, filed Sept. 21, 1984, all of which are hereby incorporated by reference. Also suitable for use in this invention are dihydridosilazane polymers prepared by the reaction of $H_2SiX_2$, where X=a halogen atom, and $NH_3$. These $(H_2SiNH)_n$ polymers are well known in the art, but have not been used for the protection of electronic devices. (See, for example, Seyferth, U.S. Pat. No. 4,397,828, issued Aug. 9, 1983).

Also to be included as preceramic silicon nitrogen-containing polymer materials useful within the scope of the present invention for the protection of electronic devices are the novel preceramic polymers derived from cyclic silazanes and halogenated disilanes, and also the novel preceramic polymers derived from cyclic silazanes and halosilanes. These materials are disclosed and claimed in patent applications of Ser. Nos. 926,145, titled "Novel Preceramic Polymers Derived From Cyclic Silazanes And Halogenated Disilanes And A Method For Their Preparation", and 926,607, titled "Novel Preceramic Polymers Derived From Cyclic Silazanes And Halosilanes And A Method For Their Preparation", respectively, filed in the name of Loren A. Haluska and hereby incorporated by reference. The above-described novel preceramic silicon nitrogen-containing polymers derived from cyclic silazanes and halosilanes and/or halogenated disilanes are also useful for the protection of any substrate able to withstand the temperatures necessary for ceramification of the preceramic polymers. Still other silicon-and nitrogen-containing materials may be suitable for use in the present invention.

In the instant invention, a preceramic polymer containing silicon and nitrogen is diluted to low solids (e.g., 0.1 to 5 weight %) in a solvent such as toluene or n-heptane. The silicon nitrogen-containing polymer solvent solution is coated (by any method discussed above) onto the electronic device previously coated with the ceramified $SiO_2$-containing material and the solvent allowed to evaporate by drying in an inert or ammonia-containing atmosphere. By this means is deposited a preceramic polymer coating which is ceramified by heating the coated device for approximately one hour at temperatures up to 400 degrees Centigrade under argon. Thin ceramic or ceramic-like passivating coatings of less than 2 microns (or approximately 3000 to 5000 A) are thus produced on the devices.

A preferred temperature range for ceramifying or partially ceramifying the silicon nitrogen-containing preceramic polymer is from 200 to 400 degrees Centigrade. A more preferred temperature range for ceramifying the silicon nitrogen-containing preceramic polymer is from 300 to 400 degrees Centigrade. However, the method of applying the heat for the ceramification or partial ceramification of the silicon nitrogen-containing coating is not limited to conventional thermal methods. The silicon nitrogen-containing polymer coatings useful as planarizing and passivating coatings in the instant invention can also be cured by other radiation means, such as, for example, exposure to a laser beam. However, the present invention is not limited to ceramification temperatures below 400° Centigrade. Ceramification techniques utilizing temperatures up to and including at least 1000° Centigrade will be obvious to those skilled in the art, and are useful in the present invention where the substrate can withstand such temperatures.

By "cure" in the present invention is meant coreaction and ceramification or partial ceramification of the starting material by heating to such an extent that a solid polymeric ceramic or ceramic-like coating material is produced.

Alternatively, in the three layer coating of the instant invention, the second and passivating coating can be selected from the group consisting of silicon nitrogen-containing material, silicon carbon nitrogen-containing material, and silicon carbon-containing material. The silicon nitrogen-containing material is deposited by the CVD or plasma enhanced CVD of the reaction product formed by reacting silane, halosilanes, halopolysilanes, or halodisilanes and ammonia. The silicon carbon-containin material is deposited by the CVD or plasma enhanced CVD of the reaction product formed by reacting silane, alkylsilane, halosilanes, halopolysilanes, or halodisilanes and an alkane of one to six carbon atoms or alkylsilane. The silicon carbon nitrogen-containing material is deposited by the CVD or PECVD of hexamethyldisilazane or by the CVD or PECVD of mixtures comprising a silane, alkylsilane, alkane, and ammonia.

The silicon-containing third layer or topcoat of the composite coatings of the present invention can be obtained at relatively low reaction temperature by the metal-assisted CVD process, mentioned supra and claimed in the parallel U.S. patent application, Ser. No. 835,029 which was filed Feb. 28, 1986, in the name of Sudarasanan Varaprath titled "Silicon-containing Coatings and a Method for Their Preparation", or by conventional non-metal assisted CVD or plasma enhanced CVD techniques. The metal-assisted CVD process is particularly suited for the deposition of coatings from $SiCl_4$, $SiBr_4$, $HSiI_3$, $HSiCl_3$, and $HSiBr_3$.

The choice of substrates and devices to be coated by the instant invention is limited only by the need for thermal and chemical stability of the substrate at the lower decomposition temperature in the atmosphere of the decomposition vessel.

The process of the present invention provides onto the electronic devices coated with ceramified hydrogen silsesquioxane resin $(HSiO_{3/2})_n$ material and ceramified silicon nitrogen-containing material, a silicon-containing topcoating of a thickness which can be varied as desired depending upon the concentration of the silicon halides that are being reduced. The top coatings of the instant invention can be deposited by any known state-of-the-art technique.

Coatings produced by the instant invention possess low defect density and are useful on electronic devices as protective coatings, as corrosion resistant and abrasion resistant coatings, as temperature and moisture resistant coatings, and as a diffusion barrier against ionic impurities such as $Na^+$ and $Cl^-$, and as dielectric layers. The coatings are also useful as dielectric layers, doped dielectric layers to produce transistor-like devices, pigment loaded binder systems containing silicon to produce capacitors and capacitor-like devices, multilayer devices, 3-D devices, silicon-on-insulator (SOI) devices, and super lattice devices. The $SiO_2$ and silicon nitrogen-containing ceramic or ceramic-like coatings of the instant invention are also useful as interlevel dielectrics within the body of the electronic device and between the metallization layers, thereby replacing spin-on glass films.

Another unique aspect of the coatings produced by the present invention is their transparency to electromagnetic radiation. Thus a particular advantage of the coatings of the present invention is utilization on focal plane arrays, photovoltaic cells, or opto-electronic devices in which electromagnetic radiation can pass into or emanate from the coated device.

By way of further illustration, and without limiting the scope of the claims, the following examples are provided.

EXAMPLE 1

Non-catalyzed Planarizing Coating

A preceramic polymer containing hydrogen silsesquioxane resin, $(HSiO_{3/2})_n$, produced by the method of Frye, et al. U.S. Pat. No. 3,615,272, issued Oct. 26, 1971, was diluted to low solids, 5 weight percent, in n-heptane. The preceramic polymer solvent solution was then flow coated onto a CMOS electronic device and the solvent allowed to evaporate by drying. The $(HSiO_{3/2})_n$ resin was oxidized in air for 60 minutes to form $SiO_2$. By this means was deposited a preceramic polymer coating onto the electronic device which was ceramified by heating the coated device in a 2 inch Lindberg furnace for approximately one hour at 400 degrees Centigrade. Thin ceramic planarizing coatings of less than 2 microns (or approximately 4000 Angstroms) were thus produced on the devices. Gravimetric analysis indicated a 20% weight loss in the hydrogen silsesquioxane resin occurred during the oxidative cure.

EXAMPLE 2

Platinum Catalyzed Planarizing Coating

A preceramic polymer containing hydrogen silsesquioxane resin, $(HSiO_{3/2})_n$, prepared as in Example 1, was diluted to low solids, 5 weight percent, in n-heptane. The hydrogen silsesquioxane resin solution was catalyzed with 0.01 grams of toluene in which was dissolved 60 parts per million of $(CH_3CH_2S)_2PtCl_2$. The catalyzed preceramic polymer solvent solution was then flow coated onto a CMOS electronic device and the solvent allowed to evaporate by drying. The $(HSiO_{3/2})_n$ resin was oxidized in air for 60 minutes to form $SiO_2$. By this means was deposited a preceramic polymer coating onto the electronic device which was ceramified by heating the coated device for approximately one hour at 400 degrees Centigrade. Thin ceramic planarizing coatings of less than 2 microns (or approximately 4000 A) were thus produced on the devices. Gravimetric analysis indicated a 14% weight loss in the hydrogen silsesquioxane resin occurred during the oxidative cure. This significant improvement in reduction of weight loss during the oxidative cure of the hydrogen silsesquioxane resin resulting from the platinum catalysis is indicative of improved crosslinking of the resin to form higher molecular weight polymers, a feature important in ceramification.

EXAMPLE 3

Rhodium Catalysis

A preceramic polymer containing hydrogen silsesquioxane resin was diluted to low solids, 1 weight percent, in n-heptane. The preceramic polymer solution was catalyzed by adding 0.01 grams of 0.5% solution in n-heptane of rhodium catalyst $RhCl_3(CH_3CH_2CH_2CH_2S)_3$, obtained from Dow Corning Corporation, Midland, Mich, as DC2-7039. The catalyzed solution was then flow coated onto an electronic device and the solvent allowed to evaporate by drying for sixty minutes. The catalyzed hydrogen silsesquioxane resin was then oxidized and ceramified by heating the coated device in a 2 inch Lindberg furnace to 400 degrees Centigrade for sixty minutes to form a $SiO_2$-containing coating on the device.

EXAMPLE 4

A preceramic silazane polymer, prepared by the method of Cannady in Example 1 in U.S. Pat. No. 4,540,803, was diluted to 1.0 weight percent in toluene. The preceramic silazane polymer solvent solution was then flow coated onto the coated electronic devices of Examples 2 and 3 and the solvent was allowed to evaporate by drying in the absence of air. By this means was deposited a preceramic polymer passivating coating which was ceramified by heating the coated device for approximately one hour at 400 degrees Centigrade under argon. Thin silicon-nitrogen-containing ceramic or ceramic-like passivating coatings of less than 2 microns (or approximately 3000 Angstroms) were thus produced on the devices.

EXAMPLE 5

Using the procedure of Example 4, a preceramic silazane polymer containing about 5 percent titanium, prepared by the method of Haluska in Example 13 in U.S. Pat. No. 4,482,689, was flow coated onto the SiO$_2$-containing coated electronic device of Example 2 and the solvent allowed to evaporate by drying. By this means was deposited a silicon nitrogen-containing preceramic polymer coating which was ceramified by heating the coated device for approximately one hour at temperatures up to 400 degrees Centigrade under argon. Thin silicon nitrogen-containing ceramic or ceramic-like passivating coatings of less than 2 microns (or approximately 3000 Angstroms) were thus produced on the devices.

EXAMPLE 6

Using the procedure of Example 4, a preceramic silazane polymer, prepared by the method of Gaul in Example 1 in U.S. Pat. No. 4,395,460, was coated onto the SiO$_2$-containing coated electronic device prepared by the method of Example 2 and the solvent allowed to evaporate by drying. By this means was deposited a preceramic polymer coating which was ceramified by heating the coated device for approximately one hour at temperatures up to 400 degrees Centigrade under argon. Thin silicon nitrogen-containing ceramic or ceramic-like passivating coatings of less than 2 microns (or approximately 3000 Angstroms) were thus produced on the devices.

EXAMPLE 7

A 1-2 weight % solution in diethyl ether of dihydridosilazane polymer, prepared by the method of Seyferth in Example 1 in U.S. Pat. No. 4,397,828, was flow coated onto a CMOS device previously coated by the method of Example 2, above. The coated device was heated in nitrogen for one hour at 400° C. The coating and pyrolysis treatment did not adversely affect the device function, as determined by a CMOS circuit tester. The coated device withstood 0.1M NaCl exposure for over four and one half hours before circuit failure. A nonprotected CMOS device will fail to function after exposure to a 0.1M NaCl solution for less than one minute.

EXAMPLE 8

The electronic devices coated with the planarizing and/or passivating coatings of Examples 5, 6, and 7 were overcoated with the third coating of the present invention as follows; Hexafluorodisilane, 500 Torr, was placed in a Pyrex glass reaction container along with an electronic device, previously coated with a catalyzed SiO$_2$ coating and a ceramified silicon nitrogen-containing material. The hexafluorodisilane was transferred to the glass container in such a manner as to preclude exposure to the atmosphere. The reaction container was then attached to a vacuum line, the contents evacuated, and the container thoroughly heated under vacuum with a gas-oxygen torch. The container was sealed with a natural gas-oxygen torch and heated in an oven for 30 minutes at a temperature of approximately 360 degrees Centigrade. During this time the hexafluorodisilane starting material decomposed and formed a silicon-containing topcoat on the previously coated electronic device. The reaction by-products, mixtures of various halosilanes, and any unreacted starting material were removed by evacuation after the container had been reattached to the vacuum line. The ceramic coated electronic device, onto which the decomposed hexafluorodisilane starting material has deposited a silicon-containing topcoating, was then removed.

EXAMPLE 9

Using the procedure described in Example 8, dichlorodisilane was thermally decomposed in the presence of the ceramic or ceramic-like SiO$_2$ and silicon nitrogen coated electronic device. An amorphous silicon-containing topcoat was thereby deposited onto the ceramic or ceramic-like coated electronic device. The coated device was tested and all electronic circuits were operable.

That which is claimed is:

1. A process for forming on a substrate a multilayer, ceramic or ceramic-like, coating which process comprises:
 (I) (A) coating an electronic device with a planarizing coating by means of diluting hydrogen silsesquioxane resin with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device; (B) drying the catalyzed diluted hydrogen silsesquioxane resin solution so as to evaporate the solvent and thereby deposit a catalyzed hydrogen silsesquioxane resin preceramic coating on the electronic device; (C) ceramifying the catalyzed hydrogen silsesquioxane resin preceramic coating to silicon dioxide by heating the coated device to a temperature between 150 and 1000 degrees Centigrade to produce a ceramic or ceramic-like planarizing coating;
 (II) applying to the ceramic or ceramic-like planarizing coating a passivating coating selected from the group consisting of (i) a silicon nitrogen-containing coating, (ii) a silicon carbon-containing coating, and (iii) a silicon carbon nitrogen-containing coating, wherein the silicon nitrogen-containing coating is applied onto the planarizing coating of the electronic device by a means selected from the group consisting of (a) chemical vapor deposition of a silane, halosilane, halodisilane, halopolysilane or mixtures thereof in the presence of ammonia, (b) plasma enhanced chemical vapor deposition of a silane, halosilane, halodisilane, halopolysilane or mixtures thereof in the presence of ammonia, (c) ceramification of a silicon and nitrogen-containing preceramic polymer; and wherein the silicon carbon nitrogen-containing coating is applied onto the planarizing coating of the electronic device by a means selected from the group consisting of (1) chemical vapor deposition of hexamethyldisilazane, (2) plasma enhanced chemical vapor deposition of hexamethyldisilazane, (3) chemical vapor deposition of a silane, alkylsilane, halosilane, halodisilane, halopolysilane or mixture thereof in the presence of an alkane of one to six carbon atoms or an alkylsilane and further in the presence of ammonia, and (4) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia; and wherein the silicon carbon-containing coating is deposited by a means selected from the group consisting of (i) chemical vapor deposition of an alkylsilane, halosilane, halodisilane, halopolysilane or mixtures thereof in the presence of an alkane of one to six carbon atoms or an alkylsilane and (ii) plasma enhanced chemical vapor deposition of a halosilane, halodisilane, halopolysilane or mixtures thereof in the presence of an alkane of one to six carbon atoms or an alkylsilane, to produce the passivating ceramic or ceramic-like coating, and (III) applying to the passivating ceramic or ceramic-like coating a silicon-containing coating selected from the group consisting of (i) silicon coating, (ii) silicon carbon-containing coating, (iii) silicon nitrogen-containing coating, and (iv) silicon carbon nitrogen coating, wherein the silicon coating is applied onto the passivating coating by a means selected from the group consisting of (a) chemical vapor deposition of a silane, halosilane, halodisilane, halopolysilane or mixtures thereof, (b) plasma enhanced chemical vapor deposition of a silane, halosilane, halodisilane, halopolysilane or mixtures thereof, or (c) metal assisted chemical vapor deposition of a halosilane, halodisilane, halopolysilane or mixtures thereof, and wherein the silicon carbon coating is applied by a means selected from the group consisting of (1) chemical vapor deposition of a silane, alkylsilane, halosilane, halodisilane, halopolysilane or mixtures thereof in the presence of an alkane of one to six carbon atoms or an alkylsilane, (2) plasma enhanced chemical vapor deposition of an alkylsilane, halosilane, halodisilane, halopolysilane or mixtures thereof in the presence of an alkane of one to six carbon atoms or an alkylsilane; and wherein the silicon nitrogen-containing coating is deposited by a means selected from the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane or mixtures thereof in the presence of ammonia, and (C) ceramification of a silicon and nitrogen-containing preceramic polymer, and wherein the silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of a silane, alkylsilane, halosilane, halodisilane, halopolysilane or mixture thereof in the presence of an alkane of one to six carbon atoms or an alkylsilane and further in the presence of ammonia, and (iv) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia, to produce the silicon-containing coating, whereby a multilayer, ceramic or ceramic-like, coating is obtained on the electronic device.

2. An electronic device coated by the process of claim 1.

3. A process as claimed in claim 1 wherein the coating technique used to deposit the catalyzed diluted hydrogen silsesquioxane resin preceramic material solution onto the electronic device is selected from the group consisting of spray coating, dip coating, flow coating and spin coating.

4. A process as claimed in claim 1 wherein the coated device is heated to a temperature in the range of 200 to 400 degrees Centigrade to produce the ceramic or ceramic-like planarizing coating.

5. An electronic devise containing an interlevel dielectric layer wherein the interlevel dielctric layer is formed by the process of claim 1.

6. A process for forming on a substrate a dual layer, ceramic or ceramic-like, coating which process comprises:

(I) (A) coating an electronic device with a planarizing coating by means of diluting hydrogen silsesquioxane resin with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device; (B) drying the catalyzed diluted hydrogen silsesquioxane resin solution so as to evaporate the solvent and thereby deposit a catalyzed hydrogen silsesquioxane resin preceramic coating on the electronic device; (C) ceramifying the catalyzed hydrogen silsesquioxane resin preceramic coating to silicon dioxide by heating the coated device to a temperature between 150 and 1000 degrees Centigrade to produce a ceramic or ceramic-like planarizing coating; and (II) applying to the ceramic or ceramic-like planarizing coating a passivating coating selected from the group consisting of (i) silicon nitrogen-containing coating, (ii) silicon carbon-containing coating, and (iii) silicon carbon nitrogen-containing coating, wherein the silicon nitrogen-containing coating is applied onto the planarizing coating of the electronic device by a means selected from the group consisting of (a) chemical vapor deposition of a silane, halosilane, halodisilane, halopolysilane or mixtures thereof in the presence of ammonia, (b) plasma enhanced chemical vapor deposition of a silane, halosilane, halodisilane, halopolysilane or mixtures thereof in the presence of ammonia, (c) ceramification of a silicon and nitrogen-containing preceramic polymer; and wherein the silicon carbon nitrogen-containing coating is applied onto the ceramic or ceramic-like coated electronic device by a means selected from the group consisting of (1) chemical vapor deposition of hexamethyldisilazane, (2) plasma enhanced chemical vapor deposition of hexamethyldisilazane, (3) chemical vapor deposition of a silane, alkylsilane, halosilane, halodisilane, halopolysilane or mixture thereof in the presence of an alkane of one to six carbon atoms or an alkylsilane and further in the presence of ammonia, and (4) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia; and wherein the silicon carbon-containing coating is deposited by a means selected from the group consisting of (i) chemical vapor deposition of an alkylsilane, silane, halosilane, halodisilane, halopolysilane or mixtures thereof in the presence of an alkane of one to six carbon atoms or an alkylsilane and (ii) plasma enhanced chemical vapor deposition of a an alkylsilane, silane, halosilane, halodisilane, halopolysilane or mixtures thereof in the presence of an alkane of one to six carbon atoms or alkylsilane, to produce the passivating ceramic or ceramic-like coating, whereby a dual layer, ceramic or ceramic-like coating is obtained on the electronic device.

7. An electronic device coated by the process of claim 6.

8. An electronic device containing an interlevel dielectric layer wherein the interlevel dielectric layer is formed by the process of claim 6.

9. A process for forming on a substrate a monolayer, ceramic or ceramic like, planarizing coating which process comprises:
(A) coating an electronic device with a planarizing coating by means of diluting hydrogen silsesquioxane resin with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to an electronic device;
(B) drying the catalyzed diluted hydrogen silsesquioxane resin solution so as to evaporate the solvent and thereby deposit a catalyzed hydrogen silsesquioxane resin preceramic coating on the electronic device;
(C) ceramifying the catalyzed hydrogen silsesquioxane resin preceramic coating to silicon dioxide by heating the coated device to a temperature between 150 and 1000 degrees Centigrade to thereby produce on the electronic device a monolayer, ceramic or ceramic like, planarizing coating.

10. An electronic device coated by the process of claim 9.

11. An electronic device containing an interlevel dielectric layer wherein the interlevel dielectric layer is formed by the process of claim 9.

12. A process for forming on a substrate a multilayer, ceramic or ceramic like, coating which process comprises:
(A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with said catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device at a temperature of 150 to 1000 degrees Centigrade to produce a ceramic or ceramic-like coating, and
(B) applying to the ceramic or ceramic-like coated device a silicon-containing coating by means of decomposing in a reaction chamber a silane, halosilane, halodisilane, halopolysilane, or mixture thereof in the vapor phase, at a temperature between 200 and 600 degrees Centigrade, in the presence of the ceramic coated device, whereby an electronic device containing a multilayer, ceramic or ceramic-like coating thereon is obtained.

13. A process as claimed in claim 12 wherein the silicon coating is applied by means of plasma enhanced chemical vapor deposition.

14. An electronic device coated by the process of claim 13.

15. A process as claimed in claim 12 wherein the silicon coating is applied by means of metal assisted chemical vapor deposition.

16. An electronic device coated by the process of claim 15.

17. An electronic device coated by the proces of claim 12,

18. A process for forming on a substrate a multilayer, ceramic or ceramic-like coating which process comprises:
(A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with said catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device at temperatures of 150 to 1000 degrees Centigrade to produce a ceramic or ceramic-like coating, and
(B) applying to the ceramic or ceramic-like coated device a silicon nitrogen-containing coating by means of decomposing in a reaction chamber a silane, halosilane, halodisilane, halopolysilane, or mixture thereof, and ammonia, in the vapor phase, at a temperature between 150 and 1000 degrees Centigrade, in the presence of the ceramic or ceramic-like coated device, whereby an electronic device containing a multilayer, ceramic or ceramic-like coating thereon is obtained.

19. A process as claimed in claim 18 wherein the silicon nitrogen-containing coating is applied by means of plasma enhanced chemical vapor deposition.

20. An electronic device coated by the process of claim 19.

21. A process as claimed in claim 18 wherein the silicon nitrogen-containing coating is applied by means of metal assisted chemical vapor deposition.

22. An electronic device coated by the process of claim 21.

23. An electronic device coated by the process of claim 5.

24. A process for forming on a substrate a multilayer, ceramic or ceramic-like coating which process comprises:
(A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with said catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device at temperatures of 150 to 1000 degrees Centigrade to produce a ceramic or ceramic-like coating, and (B) applying to the ceramic or ceramic-like coated device a silicon carbon-containing coating by means of decomposing in a reaction chamber an alkylsilane, silane, halosilane, halodisilane, halopolysilane, or mixture thereof, and an alkane of one to six carbon atoms or alkylsilane, in the vapor phase, at a temperature between 150 and 1000 degrees Centigrade in the presence of the ceramic or ceramic-like coated device, whereby an electronic device containing a multilayer, ceramic or ceramic-like coating thereon is obtained.

25. A process as claimed in claim 24 wherein the silicon carbon-containing coating is applied by means of plasma enhanced chemical vapor deposition.

26. An electronic device coated by the process of claim 25.

27. A process as claimed in claim 24 wherein the silicon carbon-containing coating is applied by means of metal assisted chemical vapor deposition.

28. An electronic device coated by the process of claim 27.

29. An electronic device coated by the process of claim 24.

30. A process for forming on a substrate a multilayer, ceramic or ceramic-like coating which process comprises:
- (A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with said catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device at temperatures of 150 to 1000 degrees Centigrade to produce a ceramic or ceramic-like coating, and
- (B) applying to the ceramic or ceramic-like coated device a silicon carbon nitrogen-containing coating by means of decomposing in a reaction chamber hexamethyldisilazane, in the vapor phase, at a temperature between 150 and 1000 degrees Centigrade in the presence of the ceramic or ceramic-like coated device, whereby an electronic device containing a multilayer, ceramic or ceramic-like coating thereon is obtained.

31. A process as claimed in claim 30 wherein the silicon carbon nitrogen-containing coating is applied by means of plasma enhanced chemical vapor deposition.

32. An electronic device coated by the process of claim 31.

33. A process as claimed in claim 30 wherein the silicon carbon nitrogen-containing coating is applied by means of metal assisted chemical vapor deposition.

34. An electronic device coated by the process of claim 33.

35. An electronic device coated by the process of claim 30.

36. A process for forming on a substrate a multilayer, ceramic or ceramic-like coating which process comprises:
- (A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with the catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device to a temperature between 150 and 1000 degrees Centigrade to produce a ceramic or ceramic-like coating and
- (B) applying to the ceramic or ceramic-like coating on the electronic device a passivating coating comprising a silicon nitrogen-containing material produced by means of diluting in a solvent a preceramic silicon nitrogen-containing polymer, coating the ceramic or ceramic-like coated device with the diluted preceramic silicon nitrogen-containing polymer solution drying the diluted preceramic silicon nitrogen-containing polymer solution so as to evaporate the solvent and thereby deposit a preceramic silicon nitrogen-containing coating on the ceramic or ceramic-like coated electronic device, heating the coated device to a temperature of 150 to 1000 degrees Centigrade in an inert or ammonia-containing atmosphere to produce a ceramic silicon nitrogen-containing coating, and
- (C) applying to the ceramic or ceramic-like coating on the electronic device a silicon-containing coating by means of decomposing in a reaction chamber a silane, halosilane, halodisilane or mixture thereof in the vapor phase, at a temperature between 200 and 600 degrees Centigrade, in the presence of the ceramic or ceramic-like coated device, whereby an electronic device containing a multilayer, ceramic or ceramic-like coating thereon is obtained.

37. An electronic device coated by the process of claim 36.

38. A process as claimed in claim 36 wherein the coating technique used to deposit the preceramic silicon nitrogen-containing polymer solution onto the electronic device is selected from the group consisting of spray coating, dip coating, flow coating and spin coating.

39. A process for forming on a substrate a multilayer, ceramic or ceramic-like coating which process comprises:
- (A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with said catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device to a temperature between 150 and 1000 degrees Centigrade to produce a ceramic or ceramic-like coating, and (B) applying to the ceramic or ceramic-like coated device a passivating coating comprising a silicon nitrogen-containing material produced by means of diluting in a solvent a preceramic silicon nitrogen-containing polymer, coating the ceramic ceramic-like coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the ceramic or ceramic-like coated electronic device, heating the coated device to a temperature between 150 and 1000 degrees Centigrade in an inert or ammonia-containing atmosphere to produce a ceramic silicon nitrogen-containing coating, and (C) applying to the ceramic or ceramic-like coated device a silicon nitrogen-containing coating by means of decomposing in a reaction chamber a silane, halosilane, halodisilane, halopolysilane or mixture thereof, and ammonia, in the vapor phase, at a temperature between 150 and 1000 degrees Centigrade, in the presence of the ceramic or ceramic-like coated device, whereby an electronic device containing a multilayer, ceramic or ceramic-like coating thereon is obtained.

40. An electronic device coated by the process of claim 39.

41. A process for forming on a substrate a multilayer, ceramic or ceramic-like coating which process comprises: (A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with said catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device to a temperature between 150 and 1000 degrees Centigrade to produce a ceramic or ceramic-like coating, and (B) applying to the ceramic or ceramic-like coated device a passivating coating comprising a silicon nitrogen-containing material produced by means of diluting in a solvent a preceramic silicon nitrogen-containing polymer, coating the ceramic or ceramic-like coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the ceramic or ceramic-like coated electronic device, heating the coated device to a temperature between 150 and 1000 degrees Centigrade in an inert or ammonia-containing atmosphere to produce a ceramic or ceramic-like silicon nitrogen-containing coating, and (C) applying to the ceramic or ceramic-like coated device a silicon carbon-containing coating by means of decomposing in a reaction chamber an alkylsilane, silane, halosilane, halodisilane, halopolysilane or mixture thereof, and an alkane of one to six carbon atoms or an alkylsilane, in the vapor phase, at a temperature between 150 and 1000 degrees Centigrade, in the presence of the ceramic or ceramic coated device, whereby an electronic device containing a multilayer, ceramic or ceramic-like coating thereon is obtained.

42. An electronic device coated by the process of claim 41.

43. A process for forming on a substrate a multilayer, ceramic or ceramic-like coating which process comprises:

(A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with said catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device at temperatures of 150 to 1000 degrees Centigrade to produce a ceramic or ceramic-like coating, and (B) applying to the ceramic or ceramic-like coated device a passivating coating comprising a silicon nitrogen-containing material produced by means of diluting in a solvent a preceramic silicon nitrogen-containing polymer, coating the ceramic or ceramic-like coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the ceramic or ceramic-like coated electronic device, heating the coated device to a temperature between 150 and 1000 degrees Centigrade in an inert or ammonia-containing atmosphere to produce a ceramic or ceramic-like silicon nitrogen-containing coating, and (C) applying to the ceramic or ceramic-like coated device a silicon carbon nitrogen-containing coating by means of chemical vapor deposition of hexamethyldisilazane, at a temperature between 150 and 1000 degrees Centigrade, in the presence of the ceramic or ceramic-like coated device, whereby an electronic device containing a multilayer, ceramic or ceramic-like coating thereon is obtained.

44. An electronic device coated by the process of claim 43.

45. A process for forming on a substrate a multilayer, ceramic or ceramic-like coating which process comprises:

(A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with said catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device at temperatures of 150 to 1000 degrees Centigrade to produce a ceramic or ceramic-like coating, and (B) applying to the ceramic or ceramic-like coated device a passivating coating comprising a silicon nitrogen-containing material produced by means of diluting in a solvent a preceramic silicon nitrogen-containing polymer, coating the ceramic or ceramic-like coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the ceramic or ceramic-like coated electronic device, heating the coated device to a temperature between 150 and 1000 degrees Centigrade in an inert or ammonia-containing atmosphere to produce a ceramic or ceramic-like silicon nitrogen-containing coating, and (C) applying to the ceramic or ceramic-like coated device a silicon carbon nitrogen-containing coating by means of plasma enhanced chemical vapor deposition of hexamethyldisilazane, at a temperature between 150 and 1000 degrees Centigrade, in the presence of the ceramic or ceramic-like coated device, whereby an electronic device containing a multilayer, ceramic or ceramic-like coating thereon is obtained.

46. An electronic device coated by the process of claim 45.

47. A process for forming on a substrate a dual layer, ceramic or ceramic-like coating which process comprises:

(A) coating an electronic device with a coating by means of diluting a hydrogen silsesquioxane resin preceramic material with a solvent, catalyzing the diluted hydrogen silsesquioxane resin solution with a metal catalyst selected from the group consisting of platinum catalysts and rhodium catalysts, coating an electronic device with said catalyzed diluted preceramic hydrogen silsesquioxane resin solution, drying the catalyzed diluted preceramic hydrogen silsesquioxane resin solution so as to evaporate the solvent and thereby deposit a preceramic coating on the electronic device, ceramifying the catalyzed hydrogen silsesquioxane resin to silicon dioxide by heating the coated device to a temperature between 150 and 1000 degrees Centigrade to produce a ceramic or ceramic-like coating, and (B) applying to the ceramic or ceramic-like coated device a passivating coating comprising a silicon nitrogen-containing material produced by means of diluting in a solvent a preceramic silicon nitrogen-containing polymer, coating the ceramic or ceramic-like coated device with the diluted preceramic silicon nitrogen-containing polymer solution, drying the diluted preceramic silicon nitrogen-containing polymer solution so as to evaporate the solvent and thereby deposit a preceramic silicon nitrogen-containing coating on the ceramic or ceramic-like coating of the electronic device, and heating the coated device to a temperature between 150 and 1000 degrees Centigrade in an inert or ammonia-containing atmosphere to produce a passivating silicon nitrogen-containing coating, thereby producing a dual layer, ceramic or ceramic-like coating on the electronic device.

48. A method of coating a substrate with a ceramic or ceramic-like silicon nitrogen-containing material, wherein said method comprises the steps of:

(1) diluting with a solvent a silicon and nitrogen-containing preceramic polymer produced by reacting a cyclic silazane or a mixture of cyclic silazanes with a silicon-containing material selected from the group consisting of halodisilanes and halosilanes;

(2) coating a substrate with the diluted preceramic polymer solvent solution;

(3) drying the diluted preceramic polymer solvent solution in the absence of air so as to evaporate the solvent and thereby deposit a preceramic polymer coating on the substrate; and (4) heating the coated substrate in the absence of air to produce a ceramic or ceramic-like coated substrate, 49. A process for forming on a substrate a monolayer, ceramic or ceramic-like coating which process comprises:

(A) coating a substrate with a planarizing coating by means of diluting hydrogen silsesquioxane resin with a solvent, catalyzing the diluted hydrogen silsesquioxane resin solution with a metal catalyst selected from the group consisting of platinum catalysts and rhodium catalysts, and applying the catalyzed diluted hydrogen silsesquioxane resin solution to the substrate;

(B) drying the catalyzed diluted hydrogen silsesquioxane resin solution so as to evaporate the solvent and thereby deposit a catalyzed hydrogen silsesquioxane resin preceramic coating on the substrate;

(C) ceramifying the catalyzed hydrogen silsesquioxane resin preceramic coating to silicon dioxide by heating the coated substrate to a temperature between 150 and 1000 degrees Centigrade to produce a ceramic or ceramic-like coating.

50. A substrate coated by the method of claim 49.

51. A substrate coated by a process comprising:

(A) coating a substrate with a coating by means of diluting hydrogen silsesquioxane resin with a solvent, catalyzing the solution of hydrogen silsesquioxane resin with a metal catalyst selected from the group consisting of platinum catalysts and rhodium catalysts, applying the solution of catalyzed hydrogen silsesquioxane resin to the substrate;

(B) drying the coating of the solution of catalyzed hydrogen silsesquioxane resin so as to evaporate the solvent and thereby deposit a preceramic layer of catalyzed hydrogen silsesquioxane resin on the substrate; and (C) ceramifying the preceramic layer of catalyzed hydrogen silsesquioxane resin to silicon dioxide by heating the coated substrate to a temperature between 150° C, and 1000° C.

52. A substrate as defined in claim 51 wherein the preceramic layer of catalyzed hydrogen silsesquioxane resin on the substrate is ceramified by heating in an atmosphere of air.

* * * * *